United States Patent [19]
Jeffries, III et al.

[11] Patent Number: 5,235,022

[45] Date of Patent: Aug. 10, 1993

[54] SELECTED BLOCK COPOLYMER NOVOLAK BINDER RESINS

[75] Inventors: Alfred T. Jeffries, III, Providence; Kenji Honda, Barrington, both of R.I.; Andrew J. Blakeney; Sobhy Tadros, both of Seekonk, Mass.

[73] Assignee: OCG Microelectronic Materials, Inc., Cheshire, Conn.

[21] Appl. No.: 979,889

[22] Filed: Nov. 23, 1992

Related U.S. Application Data

[60] Division of Ser. No. 711,351, Jun. 4, 1991, Pat. No. 5,188,921, which is a continuation of Ser. No. 404,139, Sep. 7, 1989, abandoned.

[51] Int. Cl.$^5$ .................. C08G 8/04; C08G 14/04; G03F 7/023
[52] U.S. Cl. .................. 528/153; 430/192; 525/480; 525/501; 528/155; 528/1
[58] Field of Search .............. 525/480, 501; 528/153, 528/155

[56] References Cited

U.S. PATENT DOCUMENTS

| | | |
|---|---|---|
| 4,642,282 | 2/1987 | Stahlhofen . |
| 4,826,821 | 5/1989 | Clements . |
| 4,835,204 | 5/1989 | Carfagnini . |

FOREIGN PATENT DOCUMENTS

| | | |
|---|---|---|
| 0273026 | 6/1988 | European Pat. Off. . |
| 59-211515 | 7/1984 | Japan . |
| 59-184337 | 10/1984 | Japan . |
| 60-97347 | 5/1985 | Japan . |
| 0329949 | 2/1991 | Japan . |

OTHER PUBLICATIONS

Non-Aqueous Titration of Polynuclear Phenolic Compounds: Part IV—Titration of Some High Molecular Weight Synthetic Compounds of Uniform Constitution by S. K. Chatterjee, Jun. 1969, pp. 605–610.
Correlation of Composition and DP of Some 3-Component Phenolic Block Copolymers with Their Titration Curves in Nonaqueous Media by S. K. Chatterjee et al., 1981, pp. 717–727.
Dissociation Behavior of Some Mixtures of Synthetic Phenolic Oligomers in Nonaqueous Media by S. K. Chatterjee et al., 1978, pp. 1031–1039.
Effect of Substitutents on the Composition and Dissociation Behavior or Some Four Component Phenolic Copolymers by S. K. Chatterjee et al., Oct. 1981.
Study of Electrochemical Properties and Formation of Some Phenolic Block Copolymers by S. K. Chatterjee et al., 1983, pp. 93–103.

*Primary Examiner*—John Kight, III
*Assistant Examiner*—T. Mosley
*Attorney, Agent, or Firm*—William A. Simons

[57] ABSTRACT

A block copolymer novolak resin composition comprising at least one unit of the reaction product of an alkali-soluble phenolic polymer and a reactive ortho, ortho bonded oligomer having the formula:

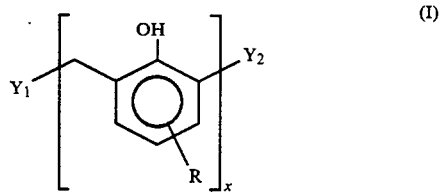

(I)

wherein x is from 2 to 7; wherein R is selected from hydrogen a lower alkyl group or lower alkoxy group having 1–4 carbon atoms and a halogen group; and $Y_1$ is either a hydroxyl group; an alkoxy group or a halogen group; and $Y_2$ is hydrogen, alkyl, alkoxy, halogen, hydroxyl, —$CH_2OH$, —$CH_2$— halogen, or —$CH_2$-alkoxy group.

6 Claims, No Drawings

SELECTED BLOCK COPOLYMER NOVOLAK BINDER RESINS

This application is a division of application Ser. No. 07/711,351, filed Jun. 4, 1991, now U.S. Pat. No. 5,788,921 which is a continuing application of Ser. No. 07/404,139, filed Sep. 7, 1989, now abandoned.

The present invention relates to selected block copolymer novolak resins containing at least one unit which is a condensation reaction product of the selected reactive ortho, ortho-bonded phenolic oligomers and selected phenolic moieties. Furthermore, the present invention relates to radiation-sensitive compositions useful as positive-working photoresist compositions, particularly, those containing these phenolic resins and o-quinonediazide photosensitizers. Still further, the present invention also relates to substrates coated with these radiation-sensitive compositions as well as the process of coating, imaging and developing these radiation-sensitive mixtures of these substrates.

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the imaging step and before the developing step. This bake step is commonly called a post-exposure bake and is used to increase resolution.

There are two types of photoresist compositions—negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed position-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less are necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree or ortho, ortho bonding. The term ortho, ortho bonding is used to refer to the location and positions of attachment of the methylene bridge between cresol nuclei. Thus, the bridge which connects two phenolic nuclei which is ortho to both phenolic hydroxyl groups is regarded as ortho, ortho.

It is thought that ortho, ortho bonding increases the interactions between the novolak and the photoactive compound in positive photoresists compared to positive photoresists containing novolaks which lack a high degree of ortho, ortho bonding in their microstructure. Although the exact character of these interactions is speculative, e.g., hydrogen bonding, van der Waals forces, etc., there is a correlation between increased resolution and contrast observed in these positive resists whose novolaks contain a high degree of ortho, ortho bonding compared to positive resists whose novolaks lack this high degree of ortho, ortho bonding.

The optimum number of consecutive ortho, ortho bonds necessary for optimum interaction between PAC and novolak and their dispersion throughout the novolak microstructure and molecular weight range is not known. The use of novolaks having high or complete ortho, ortho bonding in photoresists is correlated with undesired residues in the exposed and developed areas. Having the optimum number of ortho, ortho bonds distributed properly may minimize or eliminate this problem.

Accordingly, the present invention is directed to a block copolymer novolak binder resin comprising at least one unit of the reaction product of an alkali-soluble phenolic moiety (Compound A) with a reactive ortho-ortho bonded phenolic oligomer (Compound B) which has the formula (I):

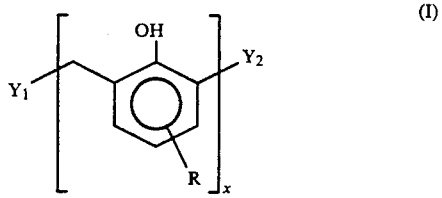

wherein x is from 2 to 7; wherein R is selected from hydrogen, a lower alkyl group or lower alkoxy group having 1–4 carbon atoms and a halogen group; and $Y_1$ is either a hydroxyl group, an alkoxy group, or a halogen group and $Y_2$ is hydrogen, lower alkyl or lower alkoxy having 1–4 carbon atoms, halogen, a hydroxyl group, a —$CH_2OH$ group, —$CH_2$— halogen group, or —$CH_2$—alkoxy group.

Moreover, the present invention is directed to a radiation-sensitive composition useful as a positive photoresist comprising an admixture of o-quinonediazide compound and binder resin comprising at least one unit of the condensation product described above; the amount of said o-quinonediazide compound or compounds being about 5% to about 40% by weight and the amount of said binder resin being about 60% to 95% by weight, based on the total solid content of said radiation-sensitive composition.

Also further, the present invention encompasses said coated substrates (both before and after imaging) as novel articles of manufacture.

Still further, the present invention also encompasses the process of coating substrates with these radiation-sensitive compositions and then imaging and developing these coated substrates.

The alkali soluble phenolic moiety (Compound A) is any alkali soluble phenolic moiety which has at least two phenolic nuclei and at least two unsubstituted positions ortho and para to the hydroxyls in the moiety. Preferred alkali soluble phenolic moieties are polyvinyl phenol, and polymers or oligomers made from the acid catalyzed condensation reaction of formaldehyde with phenol, substituted phenols, or mixtures thereof. Preferred substituted phenols include m-cresol, o-cresol, 3,4-xylenol, 2,3-xylenol, 2,5-xylenol, 3,5-xylenol, 2-methoxyphenol, 3-methoxyphenol, 4-methoxyphenol, 2-chlorophenol, 3-chlorophenol, 2-chloro-3-methylphenol, 2-chloro-5-methylphenol, 3-chloro-5-methylphenol, 2-ethylphenol, 3-ethylphenol, hydroquinone, resorcinol, 4-chlororesorcinol, 4-ethylresorcinol, 5- or 2-methylresorcinol, and catechol as well as Bisphenol A. Most preferred Compounds A are oligomers and polymers prepared from m-cresol, o-cresol, or phenol condensed with an aldehyde source.

Compounds A are commercially available or may be prepared by the acid and heat catalyzed condensation of formaldehyde or formaldehyde equivalent with phenol, substituted phenols, or mixtures thereof. Suitable acid catalysts include oxalic acid, maleic acid, hydrochloric acid, sulfonic acids, and other acid catalysts known to those skilled in the art of novolak synthesis. Typically, the formaldehyde to phenolic ratio (f/p ratio) used in the preparation of Compounds A is about 0.8 or lower.

After suitable reaction time (typically 2–24 hours depending on catalyst and monomer reactivity), volatile reaction products and monomers are removed by distillation to yield substantially pure Compounds A.

Compounds B may be any phenolic block which is connected by ortho, ortho bonds and substituted as defined above. Preferred R groups include methyl, ethyl, methoxy, ethoxy, chlorine, and bromine. Most preferred are methyl and methoxy. Preferred x is 2–6. Most preferred x is 2–4. Preferred $Y_1$ is hydroxyl or chloro or bromo groups. Preferred $Y_2$ is hydrogen, $CH_2OH$, $CH_2Cl$, $CH_2Br$, methyl, methoxy, chloro, and bromo.

Compounds B may be prepared by mono- or bishydroxymethylation or mono or bischloromethylation of the corresponding block segment. Bishydroxymethylatio is conveniently carried out by reaction with excess formaldehyde or equivalent with heat under basic conditions. Suitable base catalysts include the hydroxides of sodium, potassium, and tetramethyl ammonium. An additional water miscible solvent (e.g., methanol or ethanol) may be used to facilitate the reaction. Mono or bischloromethylation of phenolics may be carried out using chloromethyl methyl ether and a zinc chloride. Alternatively, the mono or bis-chloromethyl compound may be prepared from the chlorination of the corresponding methanol.

In making the present class of resins, the precursors, Compounds A and B, are placed in a reaction vessel which also contains an acid catalyst and solvent. The mixture is then heated to a temperature in the range from about 60° C. to about 120° C., more preferably from about 80°–110° C., for the condensation polymerization or grafting process to occur. The reaction time will depend on the specific reactants and catalyst used. Reaction times from 3–24 hours are generally suitable. The reaction volatiles and solvent are then removed by distillation to yield the desired product.

Typical catalysts include oxalic acid, maleic acid, hydrochloric acid, sulfonic acids, and other acid catalysts known to those skilled in the art of novolak synthesis. Preferred catalyst include oxalic and maleic acid. The most preferred catalyst is oxalic acid. The acid catalyst concentration may range from about 0.1% to about 1%.

Solvents which may be employed are those of medium polarity which are not extremely acid and/or water sensitive. Suitable solvents include ethereal solvents such as THF and dioxane, alcoholic solvents such as ethanol, butanol, and 1-methoxy-2-propanol, or other solvents such as toluene and xylene. Preferred solvents are the alcoholic or ethereal solvents with boiling points between 80° and 220° C.

The above-discussed resins of the present invention may be mixed with photoactive compounds to make radiation-sensitive mixtures which are useful as positive acting photoresists. The preferred class of photoactive compounds (sometimes called sensitizers) is o-quinonediazide compounds particularly esters derived from polyhydric phenols, alkyl-polyhydroxyphenones, aryl-polyhydroxyphenones, and the like which can contain up to six or more sites for esterification. The most preferred o-quinonediazide esters are derived from o-naphthoquinone-(1,2)-diazide-4-sulfonic acid and o-naphthoquinone-(1,2) diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinone- diazide-5-sulfonic acid esters, 2,3,4,4'-tetrahydroxy-benzophenone 1,2-naphthoquinonediazide-5-sulfonic acid esters, 2,3,4,4'-tetrahydroxy-benzophenone 1,2-naphthoquinonediazide-4-sulfonic acid esters, 2,2',3,4',6'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)-hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGrae-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effective utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred. These 1,2-quinonediazide compounds may be used alone or in combination of two or more.

Among these most preferred 1,2-naphthoquinone-5-diazide compounds are 2,3,4-trihydroxybenzophenone 1,2-naphthoquinonediazide-5-sulfonic acid esters, and 2,3,4,4'-tetrahydroxybenzophenone 1,2-naphthoquinonediazide-5-sulfonic acid esters.

The proportion of the sensitizer compound in the radiation-sensitive mixture may preferably range from about 5 to about 40%, more preferably from about 10 to about 25% by weight of the non-volatile (e.g. non-solvent) content of the radiation-sensitive mixture. The proportion of total binder resin of this present invention in the radiation-sensitive mixture may preferably range from about 60 to about 95%, more preferably, from about 75 to 90% of the non-volatile (e.g. excluding solvents) content of the radiation-sensitive mixture.

These radiation-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polyvinylphenol resins commonly used in the photoresist art. If other binder resins are present, they will replace a portion of the binder resins of the present invention. Thus, the total amount of the binder resin in the radiation-sensitive composition will be from about 60% to about 95% by weight of the total non-volatile solids contents of the radiation-sensitive composition.

The resins and sensitizers may be dissolved in a solvent or solvents to facilitate their application to the substrate. Examples of suitable solvents include methoxyacetoxy propane, ethyl cellosolve acetate, n-butyl acetate, diglyme, ethyl lactate, ethyl 3-ethoxy propionate, propylene glycol alkyl ether acetates, or mixtures thereof and the like. The preferred amount of solvent may be from about 50% to about 500% or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm ]e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs, Reg. No. 92-71-7) and 2-(4-biphenyl)-6-phenylbenzoxazole (PBBO-Chem. Abs, Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to ten percent weight levels, based on the combined weight of resin and sensitizer.

Anti-striation agents level out the photoresist coating or film to a uniform thickness. Anti-striation agents may be used up to five percent weight levels, based on the combined weight of resin and sensitizer. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; phenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer.

The prepared radiation-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stenciles, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline develops include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explictly stated otherwise.

EXAMPLE 1

2,6-Bis[(2-hydroxy-5-methylphenyl)methyl]-4-methylphenol (p-cresol trimer) (Compound B precursor)

A 5 liter three-necked flask was equipped with a mechanical stirring apparatus and a thermometer. The flask was charged with p-cresol (2391.1 g, 22 moles), which had been warmed to 40°-45° C., and concentrated HCl (47.3 g, 0.47 moles). 2,6-Bis(hydroxymethyl)-p-cresol (371.9 g, 2.2 moles) was added portionwise over a 15-20 minute period to the stirred reaction mixture. The temperature was controlled to a maximum temperature range of 50°-55° C. The reaction mixture was stirred for an additional 2 hours (40°-45° C. after cooling from 50°-55° C.).

The reaction mixture was transferred to a 12 liter flask. 3320 ml of toluene was added and the stirred slurry was heated to 55°-60° C. After stirring for 15 minutes, the warm slurry was filtered and the collected solid washed with 200 ml toluene. The solid was reslurried with 3320 ml toluene in the 12 liter flask and the process repeated.

The product and 4 liters of glacial acetic acid were placed in the 12 liter flask, heated to 115° C. to dissolve the product, and then allowed to cool overnight. The precipitated solid was collected by filtration and crushed. The product was then vacuum dried overnight at 40°-45° C. to yield 428.8 g (56%) p-cresol trimer (greater than 95% by HPLC).

EXAMPLE 2

3,3'[(2-Hydroxy-5-methyl-1,3-benzene)dimethylene]-bis[2-hydroxy-5-benzenemethanol] (p-cresol trimer bismethylol) (Compound B)

KOH (102.22 g of 85%, 1.55 moles uncorrected) was dissolved in 410 g deionized water and transferred to a 5 liter three-necked flask equipped with mechanical stirrer, thermometer and condenser. MeOH (410 ml) and p-cresol trimer (348 g, 1 mole) were then added and the mixture stirred until dissolution occurred. The solution was cooled to 20°-25° C. and formalin (2 liters of 36% formaldehyde) was added. After stirring for 10 minutes, the reaction mixture was heated to 50° C. and held there for 24 hours or until HPLC analysis indicated product formation was >90%.

The warm reaction was filtered to remove suspended solids. The filtrate was transferred to a 12 liter flash and 5 liters of deionized water added. Glacial acetic acid (120 ml) was added with vigorous stirring to lower the pH from about 10.7 to about 4.9. n-Butanol (2.5 liters) was added to the stirred, viscous slurry while maintaining the temperature at about 50° C. to dissolve the crude product. After stirring for 10 minutes, the phases were allowed to separate and the bottom aqueous phase was discarded. The top phase was mixed with 1 liter of water, and heated to 70° C. while stirring to break up an emulsion. The two phases were separated while warm and the top phase (butanol solution) was retained.

The butanol solution was allowed to cool to room temperature and then to 0°-5° C. overnight. The product was collected by filtration, washed with 1 liter of deionized water, suction dried, and then vacuum dried at 40°-45° C. to yield 206.95 g (54.5%) of product (greater than 95% pure).

EXAMPLES 3a-f

Preparation of m-Cresol Novolaks (Compounds A)

A one liter three-necked flask was fitted with a mechanical stirring apparatus, thermometer, and reflux condenser. To the flask was added m-cresol (216.3 g, 2 moles) and 37% formalin solution (for amounts and $CH_2O$ moles see Table I). The flask and its contents were immersed in an oil bath at 95° C. Oxalic acid dihydrate, dissolved in hot deionized water (10 mL), was added to the solution in one portion and rinsed in with hot deionized water (5 mL). The oil bath's temperature was increased to about 120° C. and the reaction was allowed to reflux for 16.5 hours. At this time, the condenser was adjusted for downward distillation and the oil bath temperature as increased to 200° C. After all the atmospheric distillation was completed, the flask and its contents were subjected to increasing vacuum. After the maximum vacuum was reached (1-5 millibar), the oil bath temperature was increased to 220° C. and distillation was continued for one hour.

TABLE I

| Example | m-cresol grams | m-cresol moles | Formalin grams | $CH_2O$ moles | $CH_2O$/ m-cresol | Yield (g) |
|---|---|---|---|---|---|---|
| 3a | 432.6 | 4 | 32.4 | 0.4 | 0.1 | 87 |
| 3b | 324.4 | 3 | 48.6 | 0.6 | 0.2 | 115 |
| 3c | 216.3 | 2 | 48.6 | 0.6 | 0.3 | 99 |
| 3d | 216.3 | 2 | 72.9 | 0.9 | 0.45 | 149 |
| 3e | 216.3 | 2 | 97.3 | 1.2 | 0.6 | 181 |

TABLE I-continued

| Example | m-cresol grams | m-cresol moles | Formalin grams | $CH_2O$ moles | $CH_2O$/ m-cresol | Yield (g) |
|---|---|---|---|---|---|---|
| 3f | 216.6 | 2 | 121.6 | 1.5 | 0.75 | 216 |

EXAMPLES 4a-d

Preparation of p-Cresol Trimer Block/m-Cresol Copolymer Novolaks

The reactions were conducted in a 250 mL three-necked flask which had been fitted with a mechanical stirring apparatus, reflux condenser and a thermometer. To the flask were added one of the m-cresol polymers (29.73 g) prepared in Example 3 and 1-methoxy-2-propanol (solvent). The flask and its contents were immersed in a 75° C. oil bath and the mixture was stirred until it had completely dissolved. The oil bath temperature was increased to 104° C. and 3,3'-[(2-hydroxy-5-methyl]-1,3-benzene)dimethylene]bis [2-hydroxy-5-benzenemethanol](p-cresol trimer bismethylol, as made in Example 2) and 50 mL of solvent were added. See Table 2 below for the specific reactants and amounts. After all the solid had completely dissolved, oxalic acid dihydrate (1.35 g) was added and the reaction mixture was heated at a pot temperature of 95° C. for 8 hours.

After the eight hour heating, the condenser was adjusted for atmospheric distillation and the bath temperature was increased to about 124° C. The bath temperature was increased to 200° C. over 30 minutes and atmospheric distillation was completed, about 45 minutes total. The flask and its contents were subjected to a gradually increasing vacuum, and once maximum vacuum is reached (about 1-5 millibar), the temperature of the oil bath was increased to about 215° C. and the distillation was continued for two hours.

TABLE II

| | p-CRESOL TRIMER BISMETHYLOL | | | M-CRESOL NOVOLAK | |
|---|---|---|---|---|---|
| Example | Amount (g) | moles | Source | Amount (g) | Yield (g) |
| 4a | 15.29 | 0.037 | 3c | 29.73 | 39.7 |
| 4b | 14.65 | 0.036 | 3b | 30.35 | 39.3 |
| 4c | 21.59 | 0.053 | 3c | 24.57 | 40.3 |
| 4d | 20.20 | 0.049 | 3b | 24.79 | 40.3 |

EXAMPLE 5

3,3'-Methylenebis[2-hydroxy-5-methylbenzenemethanol] (p-cresol dimer bismethylol) (Compound B)

NaOH (160 g of 50 percent NaOH, 2 moles) was dissolved in 200 g deionized water and transferred to a 2 liter three-necked flask equipped with mechanical stirrer, thermometer, and condenser. p-Cresol dimer (228 g, 1 m) was then added and the mixture stirred until dissolution occurred. The solution was cooled to 45° C. and formalin (1 liter of 36 percent formaldehyde) was added. The reaction mixture was stirred for 40° C. for 16 hours.

The reaction mixture was transferred to a 12 liter flask and 3750 ml of deionized water added. The warm reaction mixture was quickly filtered to remove suspended solids. The collected solid was washed with warm water and refiltered. The filtrates were combined and allowed to cool to room temperature. The precipitate was collected by filtration and transferred to a 4 liter beaker. n-Butanol (1 liter) and glacial acetic acid (100 ml) were added and the slurry heated with stirring to 50°-60° C. to dissolve the crude product. The aqueous bottom layer was separated and discarded. The n-butanol layer was allowed to cool overnight at 0°-5° C. The precipitate was collected by filtration and vacuum dried at 40°-45° C. to yield 94.5 g (32% yield) product. A second crop yielded an additional 45.8 g (20% yield) of product.

EXAMPLE 6

Preparation of p-Cresol Dimer Block/m-Cresol Copolymers p-Cresol dimer block copolymers are prepared according to the general procedure described in Example 3 using proportions shown in Table III.

TABLE III

| Example | p-CRESOL DIMER BISMETHYLOL | | | m-CRESOL NOVOLAK |
|---|---|---|---|---|
| | Amount (g) | moles | Source | Amount (g) |
| 6a | 14.42 | 0.05 | 3a | 17.55 |
| 6b | 14.42 | 0.05 | 3b | 26.33 |
| 6c | 14.42 | 0.05 | 3c | 40.95 |

EXAMPLE 7 p-Cresol Pentamer

A 250 mL three-neck flask is fitted with a mechanical stirring apparatus and a thermometer charged with p-cresol (16.8 g, 0.155 mole) and concentrated HCl (0.21 g, about 0.0022 m). 3,3'-[(2-Hydroxy-5-methyl-1,3-benzene) dimethylene]bis[2-hydroxy-5-benzenemethanol] (2.91 g, 0.0102 mole)(p-cresol trimer bismethylol from Example 2) is added in small portions over about 15 minutes keeping the reaction mixture temperature >45° C. with a water bath. The solution is the maintained at 40°-45° C. for two hours. The oil bath temperature is increased to 200° C. and a gradually increasing vacuum applied to remove reaction volatiles and excess p-cresol. After reaching maximum vacuum (about 20 millibar), the reaction mixture is heated for an additional hour to ensure removal of the unreacted p-cresol.

EXAMPLE 8 p-Cresol Pentamer Bismethylol (Compound B)

The p-cresol pentamer bismethylol is prepared according to the procedure used in Example 2 for the p-cresol trimer bismethylol.

EXAMPLE 9

Preparation of p-Cresol Pentamer Block/m-Cresol Copolymers p-Cresol pentamer block copolymers are prepared according to the procedure used in Example 4 using proportions shown in Table IV.

TABLE IV

| Example | p-CRESOL PENTAMER BISMETHYLOL | | | m-CRESOL NOVOLAK |
|---|---|---|---|---|
| | Amount (g) | moles | Example | Amount (g) |
| 9a | 32.44 | 0.05 | 3a | 29.25 |
| 9b | 32.44 | 0.05 | 3b | 43.88 |
| 9c | 32.44 | 0.05 | 3c | 68.25 |

COMPARISON 1 m-/p-Cresol Novolak

To a 5 liter three-neck round-bottom flask fitted with a mechanical stirring apparatus, a condenser, and a thermometer is added a mixture of m/p-cresols (40/60 m/p 2004.6 g, 18.537 mole) 37% formalin solution (992 g of 37% solution, 12.37 moles). the solution was heated in an oil bath at 95° C. and to the mixture was added oxalic acid dihydrate (20.0 g) in hot water (27 mL). After 15 minutes, the reaction temperature was raised to 110° C. and maintained at this temperature for 15 hours. The reaction temperature was then raised to 200° C. over two hours. During this time, the water and excess formaldehyde were removed by atmospheric distillation. The temperature was held at 200° C. for an additional two hours. The reaction was subjected to a gradually increasing vacuum at 200° C. and maintained at 200° C. for two hours to remove substantially all of the unreacted cresol monomers. The molten novolak was poured onto an aluminum foil tray. The yield was about 1500 g. This novolaks molecular weight by gel permeation chromatography was 7350.

Preparation of Photoresist Formulations

Photoresist formulations were prepared by dissolving in ethyl lactate three parts by weight of some of the alkali-soluble resins made in Example 4 with one part photoactive compound prepared by condensation of 1 mole 2,3,4,4'-tetrahydroxy-benzophenone with 2.75 moles o-napthoquinone-(1,2)-diazide-5-sulfonic acid chloride.

After mixing, the formulation was filtered through an 0.2 micron pore size filter.

PHOTORESIST PROCESSING

A. Photoresist Coatings

Photoresist solutions prepared above were spin-coated onto four inch silicon wafers, which had been primed with hexamethyldisilazane (HMDS). The coated wafers were soft baked on a hot plate for 50 seconds at 110° C. Uniform coatings, of about 1.2 micron in thickness were obtained by spinning at velocities ranging from 4000 to 6000 RPM for 30 seconds, depending upon the solution viscosity. If necessary, the solids content was adjusted to fit this spin speed range.

B. Exposure of Photoresist Coatings

Photoresist coatings were exposed on a Canon G line step and repeat exposure tool equipped with a 0.43 numerical aperture lens. This exposure tool provided a narrow spectral output at 436 nm.

C. Development of Exposed Photoresist Coatings

The exposed photoresist coatings were puddle developed using a 2.38 percent weight percent tetramethyl ammonium hydroxide aqueous developer solution in a two second spray and 58 second dwell cycle followed by rinsing and spin drying.

D. Photoresist Performance Evaluations

The photoresist formulations were evaluated for photospeed; line and space resolution; scum; and profile.

The photoresists are made from the Example 4 novolaks exhibited better profiles than the comparison resists. The Example 4 resists also exhibited similar photospeeds. The line and space resolution of the optimized comparison resist was about 0.65 microns, whereas the resolution of the unoptimized Example 4 resist were about 0.8-1 microns. The comparison resist showed no scum, whereas the resolution of Example 4 resists were limited by some scum. It is believed that resolution and objectionable scum in the Example 4 resist could be improved by adjustment in the formulation (i.e., more or less photoactive compound or use of different photoactive compound). Changes in the photoresist processing conditions are expected to improve performance characteristics.

What is claimed is:

1. A block copolymer novolak resin composition comprising at least one unit of the reaction product of (1) an alkali-soluble phenolic moiety having at least two phenolic ring nuclei and prepared by reacting a phenolic monomer precursor with an aldehyde source, said phenolic monomer precursor selected from the group consisting of m-cresol, o-cresol, 3,4-xylenol, 2,3-xylenol, 2,5-xylenol, 3,5-xylenol, 2-methoxyphenol, 3-methoxyphenol, 2-chlorophenol, 3-chlorophenol, 2-chloro-3-methylphenol, 2-chloro-5-methylphenol, 3-chloro-5-methylphenol, 2-ethylphenol, 3-ethylphenol, hydroquinone, resorcinol, 4-chloroesorcinol, 4-ethylresorcinol, 5-methylresorcinol, 2-methylresorcinol, and catechol; with (2) a reactive ortho, ortho bonded oligomer having the formula

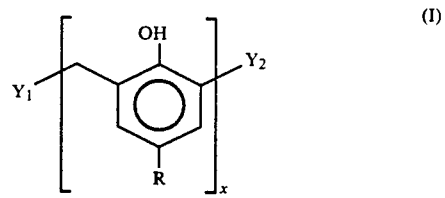

wherein x is from 2 to 4; wherein R is selected from hydrogen, a lower alkyl group or lower alkoxy group having 1-4 carbon atoms or a halogen group; and $Y_1$ is either a hydroxy group, an alkoxy group or a halogen group; and $Y_2$ is hydrogen, alkyl, alkoxy, halogen, hydroxy, $-CH_2OH$, or $-CH_2X$ wherein X is a halogen or alkoxy.

2. The novolak resin composition of claim 1 wherein said alkali-soluble phenolic moiety is an oligomer or polymer prepared from at least one phenolic monomer selected from m-cresol, o-cresol, or phenol condensed with an aldehyde source.

3. The novolak resin composition of claim 1 wherein the R group of said reactive ortho, ortho bonded oligomer is selected from methyl, ethyl, methoxy, ethoxy, chlorine, or bromine.

4. The novolak resin composition of claim 3 wherein R is methyl or methoxy.

5. The novolak resin composition of claim 1 wherein x is 3.

6. The novolak resin composition of claim 1 wherein $Y_1$ is hydroxyl, chloro or bromo and $Y_2$ is hydrogen, $-CH_2OH$, $-CH_2Cl$, $-CH_2Br$, methyl, methoxy, chloro, or bromo.

* * * * *